United States Patent
Obu et al.

(10) Patent No.: US 7,605,456 B2
(45) Date of Patent: Oct. 20, 2009

(54) INVERTER UNIT

(75) Inventors: Toshiharu Obu, Kanagawa (JP);
Nobumitsu Tada, Tokyo (JP); Hiroki Sekiya, Kanagawa (JP); Gou Ninomiya, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 376 days.

(21) Appl. No.: 11/628,250

(22) PCT Filed: Jun. 1, 2005

(86) PCT No.: PCT/JP2005/010023

§ 371 (c)(1),
(2), (4) Date: Dec. 1, 2006

(87) PCT Pub. No.: WO2005/119896

PCT Pub. Date: Dec. 15, 2005

(65) Prior Publication Data

US 2007/0217241 A1    Sep. 20, 2007

(30) Foreign Application Priority Data

Jun. 3, 2004    (JP)    ............................... 2004-165686

(51) Int. Cl.
H05K 7/20    (2006.01)
(52) U.S. Cl. .................. 257/680; 361/688; 361/699
(58) Field of Classification Search ................ 361/711, 361/688
See application file for complete search history.

(56) References Cited

U.S. PATENT DOCUMENTS 7,141,741 B2 * 11/2006 Yamada et al. ............... 174/255

| | | | |
|---|---|---|---|
| 2003/0090915 A1 | 5/2003 | Nakamura et al. | |
| 2003/0200761 A1 | 10/2003 | Funahashi et al. | |
| 2004/0195649 A1 * | 10/2004 | Miura et al. ................ | 257/529 |
| 2006/0119512 A1 * | 6/2006 | Yoshimatsu et al. ......... | 342/372 |
| 2006/0120047 A1 * | 6/2006 | Inoue ......................... | 361/699 |

FOREIGN PATENT DOCUMENTS

| | | |
|---|---|---|
| CN | 1354512 A | 6/2002 |
| JP | 7-094669 A | 4/1995 |
| JP | 2003-031732 A | 1/2003 |
| JP | 2003-153554 A | 5/2003 |
| JP | 2003-322082 A | 11/2003 |

* cited by examiner

Primary Examiner—Brook Kebede
Assistant Examiner—Mohammad Choudhry
(74) Attorney, Agent, or Firm—Foley & Lardner LLP (57) ABSTRACT

To provide an inverter unit with excellent manufacturing performance and with current carrying capacity increased and size reduced by further increasing the cooling efficiency of a power efficiency device.

The inverter unit includes: a semiconductor chip constituting an arm of an inverter; a first conductor 33 joined to a positive side of the semiconductor chip; and a second conductor 35 joined to a negative side of the semiconductor chip. The first and second conductors are disposed above a cooler 22 cooling the semiconductor chip so that a joint surface of the first conductor 33 which is joined to a positive electrode of the semiconductor chip and a joint surface of the second conductor 35 which is joined to a negative electrode of the semiconductor chip are not in parallel to a surface of the cooler 22.

10 Claims, 11 Drawing Sheets

INVERTER UNIT

TECHNICAL FIELD

The present invention relates to an inverter unit including a plurality of power semiconductor devices, a drive circuit which drives the power semiconductor devices, and a control circuit which controls the power semiconductor devices. The present invention specifically relates to a small inverter unit which has high cooling efficiency and high reliability and is suitable for use in electric automobiles.

BACKGROUND ART

Electrical automobiles require reduction in size and an improvement in reliability of power semiconductor devices and an inverter unit using the same. For the reduction in size and improvement in reliability of the power semiconductor devices and inverter unit, it is necessary to increase cooling efficiency of the power semiconductor devices and inverter unit.

Hereinafter, a conventional general inverter unit is described with reference to FIGS. 7 to 9, and a main portion of a publicly-known inverter unit with cooling efficiency increased compared to the general inverter unit is described with reference to FIGS. 10 and 11.

Figure 7:
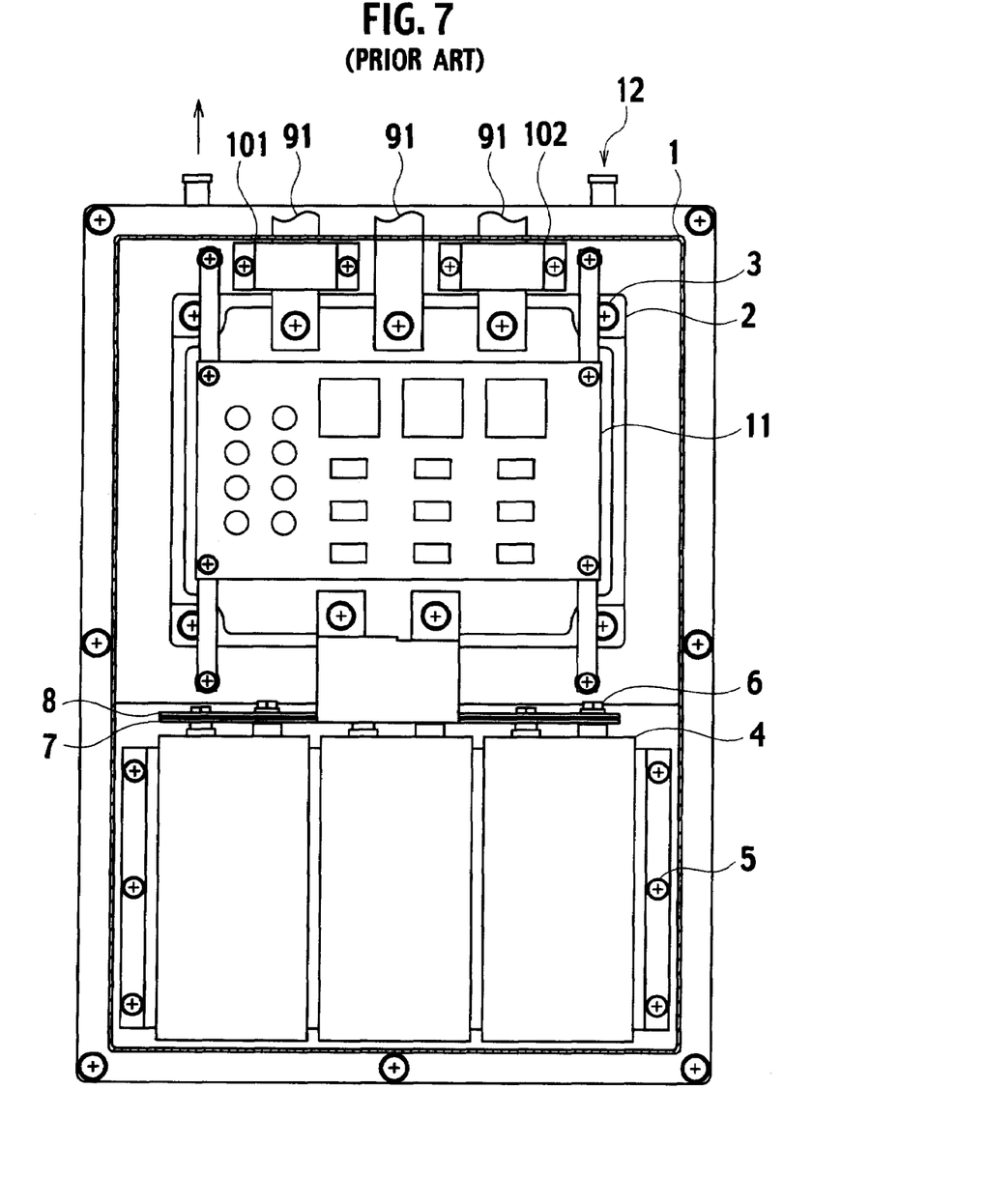
FIG. 7 is a plan cross-sectional view of a conventional general inverter unit.

FIG. 7 is a plan cross-sectional view of the conventional general inverter unit; FIG. 8 is a side cross-sectional view thereof; and FIG. 9 is a cross-sectional view of a main portion showing the inverter unit with the power semiconductor devices attached thereto.

Figure 8:
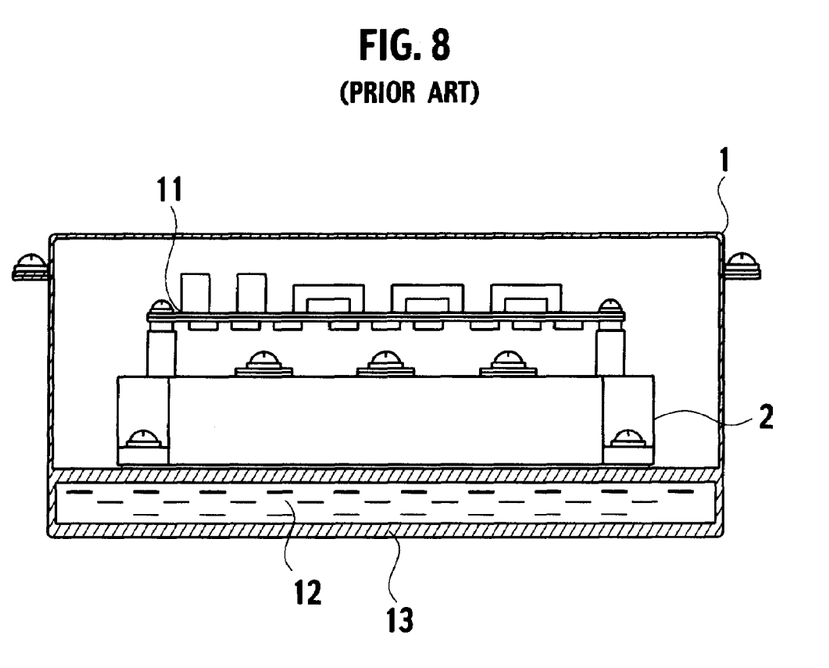
FIG. 8 is a side cross-sectional view of the inverter unit of FIG. 7.

In FIGS. 7 and 8, the inverter unit includes a power semiconductor device 2, an aluminum electrolytic capacitor 4 as a power supply smoothing capacitor, current detectors 101 and 102, and a control unit 11. The power semiconductor device 2 is attached to a bottom face of an inverter unit case 1 by attachment screws 3. The aluminum electrolytic capacitor 4 is fixed to a fixed base 5. The current detectors 101 and 102 detect currents of three-phase output conductors 91 to 93.

The power semiconductor device 2 and aluminum electrolytic capacitor 4 are electrically connected to a positive conductor 7 and a negative conductor 8 by connection screws 6. In the bottom face of the inverter unit case 1, a flow passage 13 is provided, and the power semiconductor device 2 is cooled by a refrigerant 12 flowing within the flow passage 13. The refrigerant 12 is, for example, antifreeze.

Figure 9:
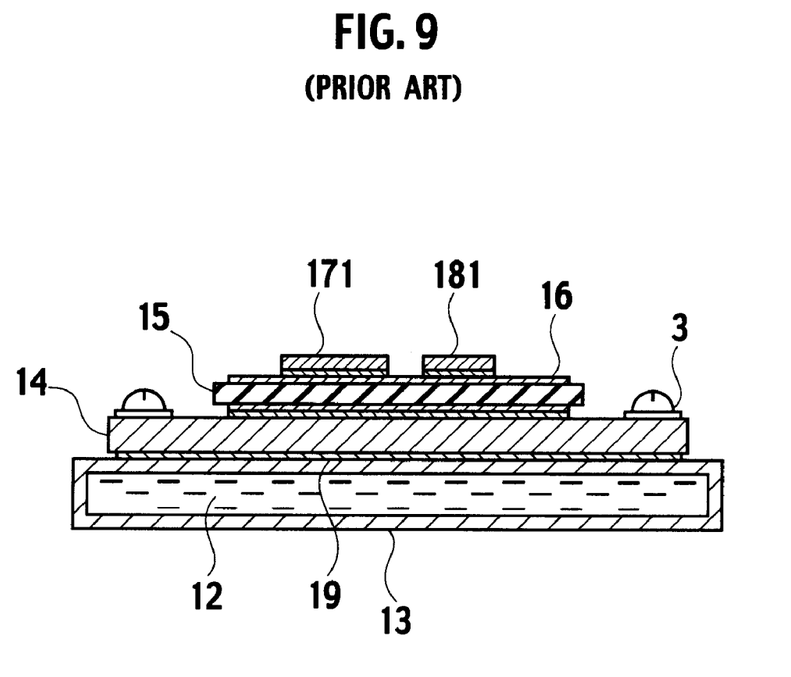
FIG. 9 is a partial cross-sectional view of the inside of a power semiconductor device in the conventional inverter unit.

As shown in FIG. 9, the power semiconductor device 2 has a layered structure which includes a radiating metal plate 14 attached to upper part of the flow passage 13; an insulating substrate 15 joined to upper part of the radiating metal plate 14; a metal electrode 16 joined to upper part of the insulating substrate 15; and an IGBT 171 and a diode 181 joined to upper part of the metal electrode 16. The IGBT 171, diode 181, metal electrode 16, and insulating substrate 15 are normally accommodated in an insulating resin package. The resin package is bonded to the radiating metal plate 14. Within the resin package, insulating gel is encapsulated.

Furthermore, on the rear surface of the radiating metal plate 14 of the power semiconductor device 2, heat transfer grease 19 is applied. The heat transfer grease 19 reduces contact thermal resistance generated when the power semiconductor device 2 is attached to the bottom face of the inverter unit case 1, for which the flow passage 13 is provided, by the attachment screws 3.

In operation of the thus structured power semiconductor device 2, heat loss is generated when the IGBT 171 and diode 181 are energized. Inside the resin package accommodating the IGBT 171 and diode 181, the insulating gel as a heat insulating material is encapsulated as described above. Accordingly, most of heat generated from the IGBT 171 and diode 181 is conducted to the metal electrode 16, which is provided under the IGBT 171 and diode 181. The heat conducted to the metal electrode 16 is conducted to the radiating metal plate 14 through the insulating substrate 15. As shown in FIGS. 7 to 9, the radiating metal plate 14 is, as previously described, pressed into contact with the bottom face of the inverter unit case 1 by the attachment screws 3 with the heat transfer grease 19 interposed therebetween. The heat generated in the IGBT 171 and diode 181 is therefore released by the refrigerant 12.

The above described conventional inverter unit includes the following problems.

First, in the conventional inverter unit, the radiating metal plate 14 is pressed into contact with the bottom face of the inverter unit case 1, which includes the flow passage 3, using the attachment screws 3 in the periphery of the power semiconductor device 2. Accordingly, the pressing force is applied only around the attachment screws 3 and not uniformly applied to the entire radiating metal plate 14. Although the heat conducing grease 19 is applied to the rear surface of the radiating metal plate 14 in order to reduce the contact thermal resistance, heat cannot be uniformly transferred from the entire rear surface of the radiating metal plate 14 to the flow passage 13. In addition, thickness of the insulating substrate 15, which is provided under the IGBT 171, is thin. Accordingly, the heat generated in the IGBT 171 cannot be sufficiently diffused within the insulating substrate 15. The contact thermal resistance between the radiating metal plate 14 and the inverter unit case 1 is therefore greatly increased to the level equivalent to thermal resistance within the power semiconductor device 2, thus providing a lower cooling efficiency.

Second, since the thickness of the insulating substrate 15, which is provided under the IGBT 171, is thin, thermal time constant (heat capacity) thereof is small. Accordingly, at inverter activation which is controversial because of a large increase in temperature of the IGBT 171 and diode 181, transient thermal resistance is large, and such a large increase in temperature cannot be suppressed.

The Japanese Patent Laid-open Publication No. 2003-153554 has proposed an inverter unit with the cooling efficiency increased by solving the above described problems of the general inverter unit. This inverter unit disclosed in the Japanese Patent Laid-open Publication No. 2003-153554 is described using FIGS. 10 and 11.

Figure 10:
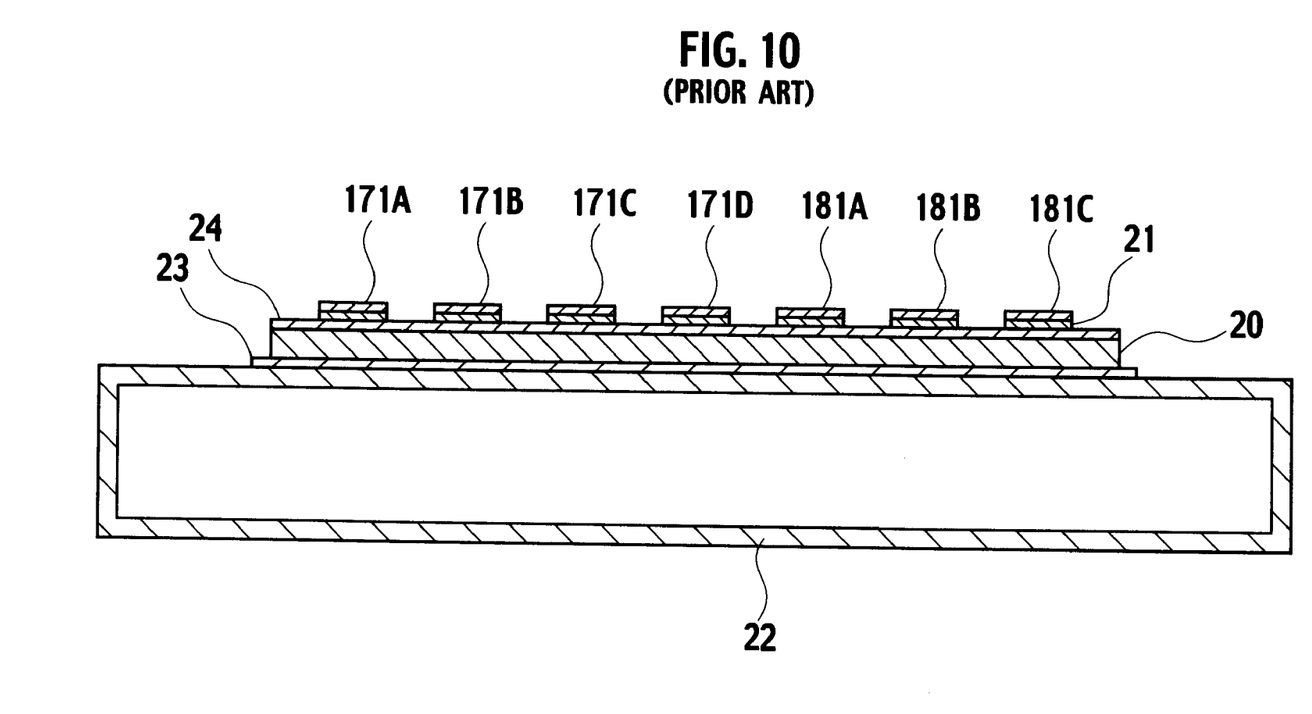

FIG. 10 is a partial longitudinal cross-sectional view of the inverter unit described in the Japanese Patent Laid-open Publication No. 2003-153554, especially showing a mounting structure of a semiconductor chip within a power semiconductor device. FIG. 11 is a partial perspective view of the power semiconductor device of the inverter unit.

In the inverter unit shown in FIG. 10, each arm of a three-phase inverter is composed of a plurality of IGBTs 171 and diodes 181, which are semiconductor chips, connected in parallel to each other. Each of these semiconductor chips is configured to have a square planar shape not more than 10 mm on a side. These semiconductor chips are joined to a conductor 20, whose thickness is not less than 1.5 mm and not more than 5 mm, and the conductor 20 is bonded to a cooler 22 by an insulating resin sheet 23 containing ceramics.

Figure 11:
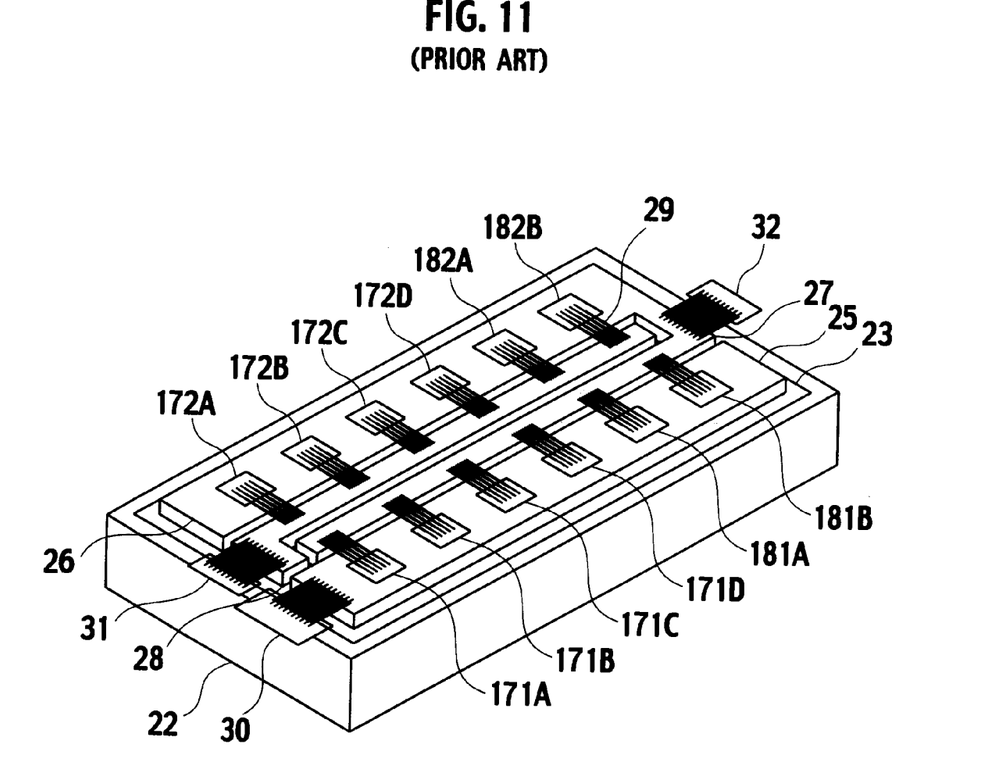
FIG. 11 is a partial perspective view of the power semiconductor device of the inverter unit described in the Japanese Patent Laid-open Publication No. 2003-153554.

As shown in FIG. 11, in the inverter unit described in the Japanese Patent Laid-open Publication No. 2003-153554, each arm of the three-phase inverter is configured to have a mounting structure of semiconductor chips shown in FIG. 10. Four IGBTs 171A to 171D connected in parallel and two diodes 181A and 181B connected in parallel, which constitute a W-phase upper arm, are arranged in a line on an upper arm conductor 25, which constitutes the upper arms of the three-phase inverter. In a similar manner, four IGBTs 172A to 172D connected in parallel and two diodes 182A and 182B connected in parallel, which constitute a W-phase lower arm, are arranged in a line on a lower arm conductor 26, which constitutes the lower arms of the three-phase inverter. Furthermore, between the upper and lower arm conductors 25 and 26, a three-phase output conductor 27 is disposed. The three-phase output conductor 27 connects the IGBTs 171A to 171D and diodes 181A and 181B, which are arranged on the upper arm conductor 25, to a three-phase output terminal 32. In the example shown in FIG. 11, the lower arm conductor 26 and three-phase output conductor 27 are formed of a same conductor. Furthermore, between the upper and lower arm conductors 25 and 26, a negative conductor 28 is disposed. The negative conductor 28 connects the IGBT 172A to 172D and diodes 182A and 182B, which are arranged on the lower arm conductor 26, to a negative terminal 31. The IGBTs and diodes are electrically connected to each conductor by bonding wires 29.

In the inverter unit described in the Japanese Patent Laid-open Publication No. 2003-153554 and shown in FIGS. 10 and 11, entire surfaces of the IGBTs 171A to 171D and diodes 181A to 181C, which are joined to the conductor 20 and upper and lower arm conductors 25 and 26, are directly bonded to the cooler 22 by use of the insulating resin sheet 23. Accordingly, there is no contact thermal resistance in a portion in contact with the cooler unlike the conventional general power semiconductor device shown in FIG. 9, and the thermal resistance of the IGBT and diode chips within the power semiconductor device is reduced by half. Furthermore, the IGBT 171A to 171D and diodes 181A to 181C are joined to the conductor 20 and upper and lower arm conductors 25 and 26, whose thicknesses are not less than 1.5 mm and not more than 5 mm. Accordingly, the thermal time constant is increased because of an effect of the thermal capacities of the conductor 20 and upper and lower arm conductors 25 and 26 to reduce the transient thermal resistance, and the increase in temperature at the inverter activation becomes small. The cooling efficiency is therefore increased, and the inverter unit can be reduced in size.

DISCLOSURE OF THE INVENTION

The inverter unit described in the Japanese Patent Laid-open Publication No. 2003-153554 can have such effects on reducing the thermal resistance of the IGBT and diode chips within the power semiconductor device by half and reducing the increase in temperature at the inverter activation. However, this inverter unit has other problems as follows.

First, main circuit wires of the plurality of IGBT or diode chips connected in parallel are electrically wired by wire bonding. Such wiring of a plurality of bonding wires takes a long time, requiring a long manufacturing time.

Moreover, even if the cooling efficiency is further tried to increase, it is difficult to further increase the cooling efficiency because of the limitation of the structure.

The present invention advantageously solves the aforementioned problems, and an object of the present invention is to provide an inverter unit with excellent manufacturing performances and with current carrying capacity increased and size reduced by further increasing a cooling efficiency of a power semiconductor device.

To achieve aforementioned object, the present invention of Claim 1 includes: a semiconductor chip constituting an arm of an inverter; a first conductor joined to a positive side of the semiconductor chip; and a second conductor joined to a negative side of the semiconductor chip and is characterized in that the first and second conductors are disposed on a cooler cooling the semiconductor chip so that a joint surface of the first conductor which is joined to a positive electrode of the semiconductor chip and a joint surface of the second conductor which is joined to a negative electrode of the semiconductor chip are not in parallel to a surface of the cooler.

The present invention of Claim 2 is characterized in that the first and second conductors are bonded and fixed to the cooler with an insulating resin sheet interposed therebetween, the insulating resin sheet containing ceramics.

The present invention of Claim 3 is characterized in that an input/output terminal insulated by an insulating resin sheet is provided on the first conductor.

The present invention of Claim 4 is characterized in that the semiconductor chip and the input/output terminal are connected by a bonding wire, and the second conductor includes a notch which allows wiring of the bonding wire.

The present invention of Claim 5 is characterized in that a control and drive substrate is provided just above the first and second conductors on a side opposite to the cooler with respect to the semiconductor chip.

In the inverter unit of the present invention, the efficiency of cooling the semiconductor chips such as IGBTs and diodes is further increased, and the thermal resistance is low. Moreover, since the semiconductor chips and the conductors are not connected by wire bonding, the inverter unit of the present invention has a short manufacturing time and provides a high manufacturing yield, and the power semiconductor device has high reliability. The inverter unit can increase in current carrying capacity, be reduced in size, and improve in reliability.

BRIEF DESCRIPTION OF THE DRAWINGS

FIG. 10 is a partial longitudinal cross-sectional view of an inverter unit described in the Japanese Patent Laid-open Publication No. 2003-153554, especially showing a mounting structure of semiconductor chips inside the power semiconductor device in.

BEST MODE FOR CARRYING OUT THE INVENTION

Hereinafter, a description is given of embodiments of the present invention with reference to the drawings.

First and Second Embodiments

First and second embodiments of the present invention are described with reference to FIGS. 1 to 5.

Figure 1:
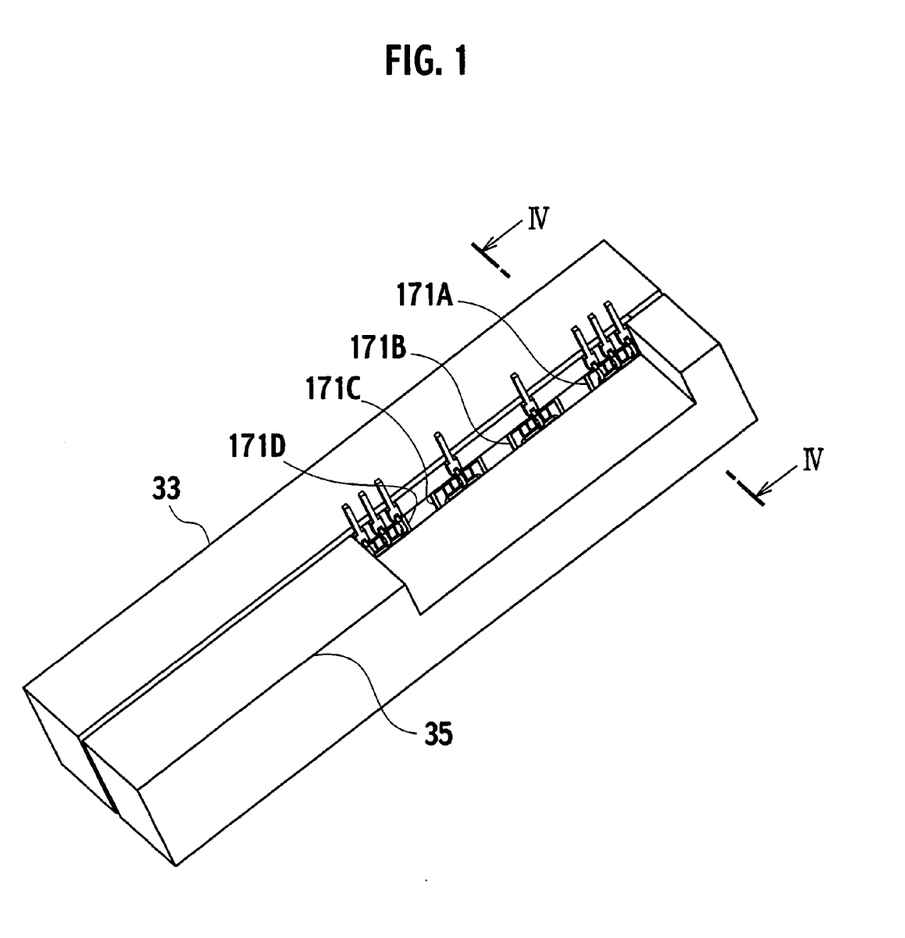
FIG. 1 is a partial perspective view of an inverter unit according to first and second embodiments of the present invention, especially showing a mounting structure of a power semiconductor device of a W-phase upper arm of a three-phase inverter.
Figure 2:
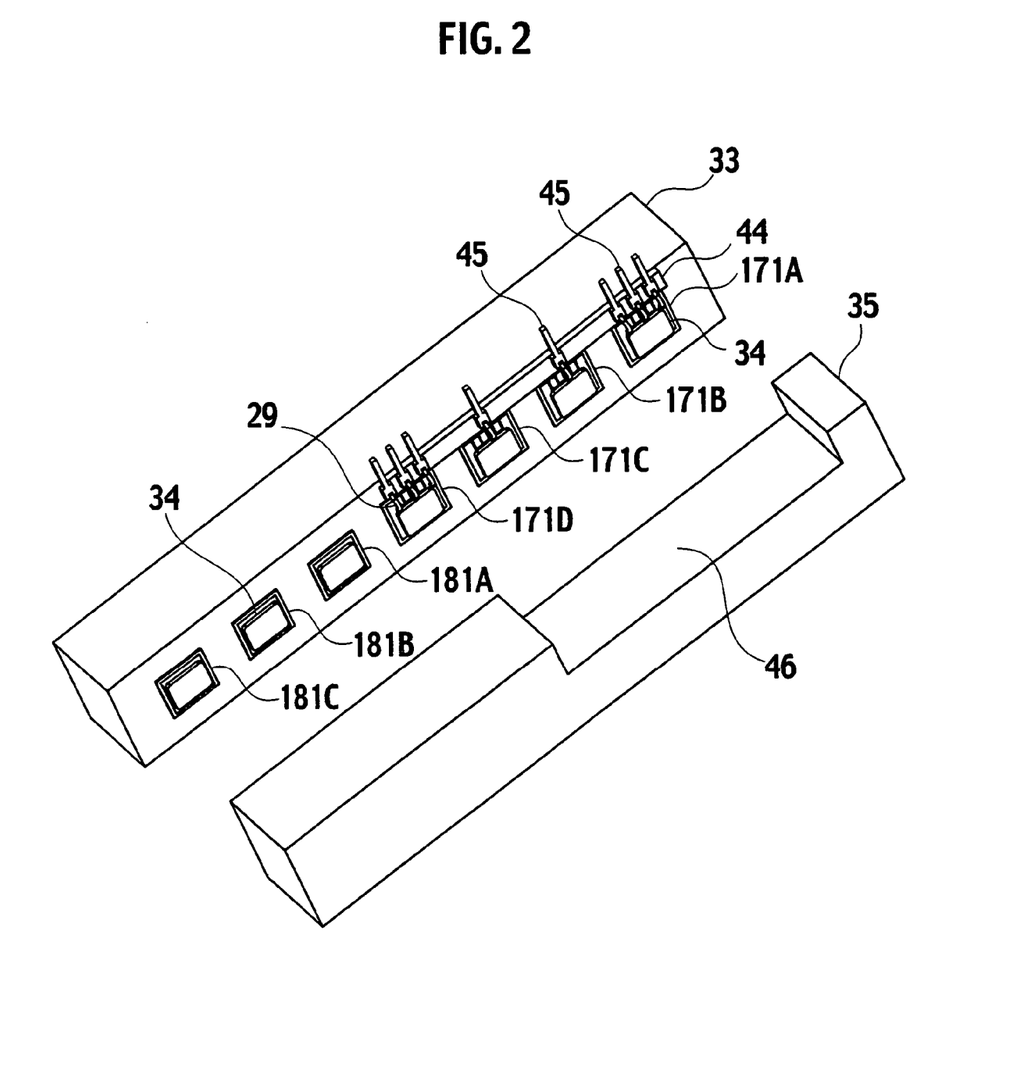
FIG. 2 is an exploded perspective view of FIG. 1.

FIG. 1 is a partial perspective view showing a mounting structure of a power semiconductor device in an inverter unit of the first and second embodiments of the present invention, especially showing an example obtained by applying the present invention to a W-phase upper arm of a three-phase inverter. FIG. 2 is an exploded perspective view of FIG. 1.

Figure 3:
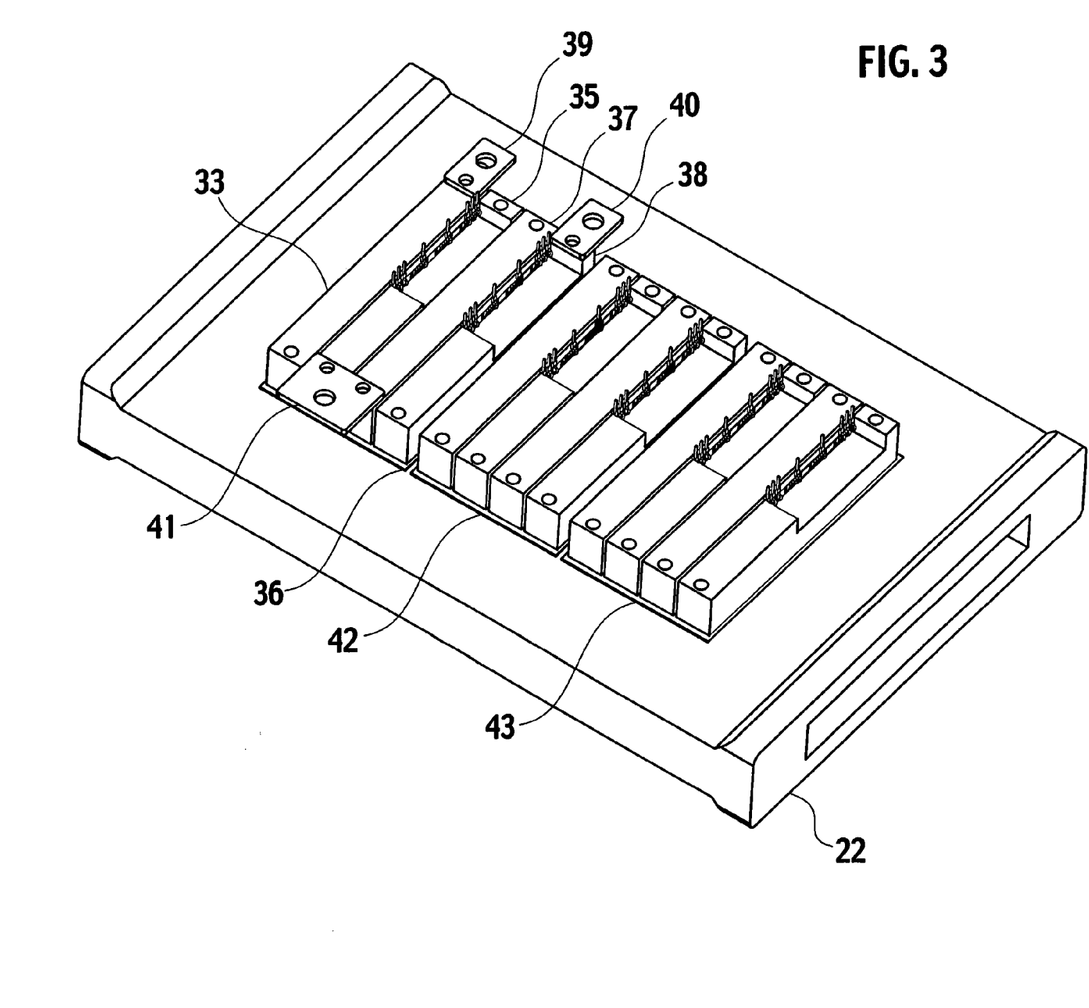
FIG. 3 is a perspective view of the inverter unit according to the first and second embodiments of the present invention, especially showing a structure in which U-, V-, and W-phase power semiconductor devices of the three-phase inverter are mounted on a cooler.

FIG. 3 is a perspective view of the inverter unit of the first and second embodiments of the present invention, especially showing a structure in which U-, V-, and W-phase power semiconductor devices of the three-phase inverter are mounted on a cooler.

Figure 4:
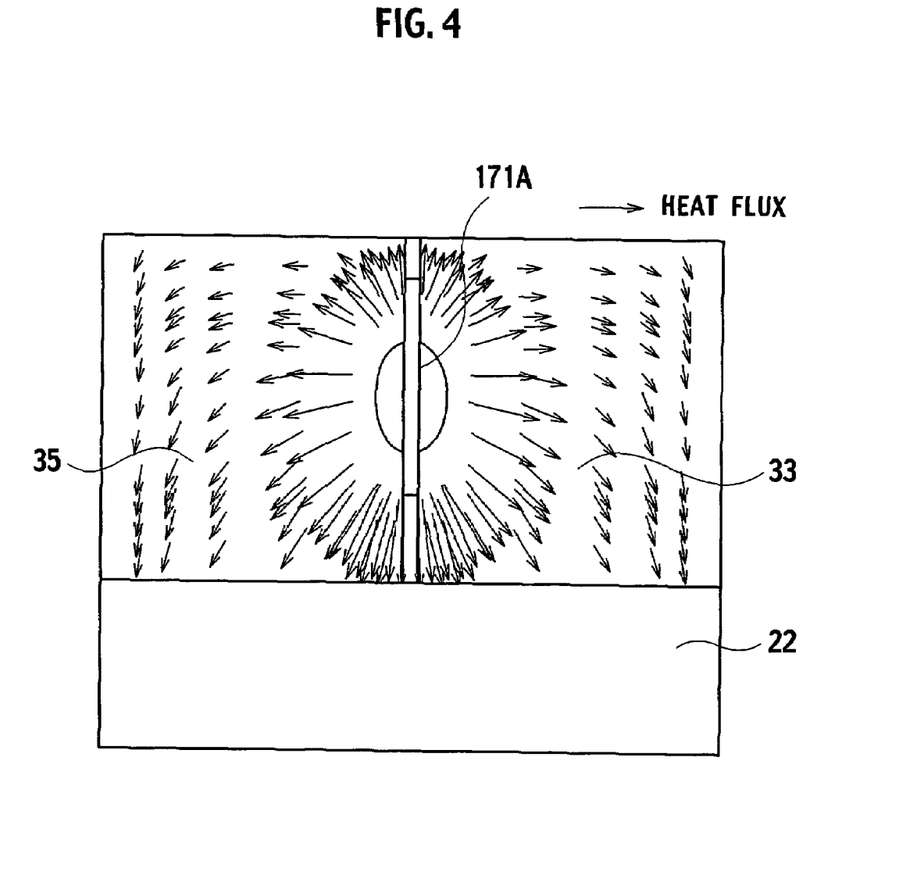
FIG. 4 is a view of an analysis result of heat flux showing radiation paths of heat generated from a semiconductor chip while the inverter device according to the first and second embodiments of the present invention is energized.

FIG. 4 is a view of an analysis result of heat flux showing radiation paths of heat generated from a semiconductor chip while the inverter unit according to the first or second embodiment of the present invention is energized.

Figure 5:
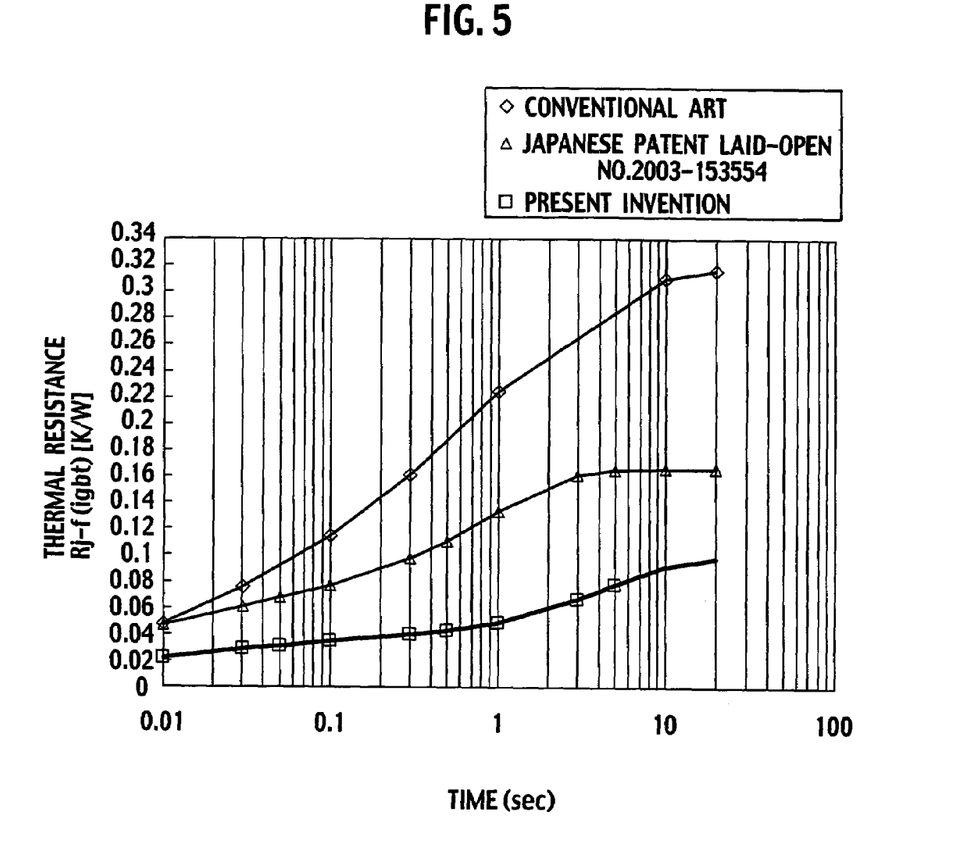
FIG. 5 is a graph showing an analysis result of transient thermal resistance of a semiconductor chip when the inverter device according to the first and second embodiments of the present invention is energized.

FIG. 5 is a graph showing an analysis result of transient thermal resistance of semiconductor chips of the inverter unit according to the first and second embodiments of the present invention.

In FIGS. 1 and 2, the inverter unit includes a W-phase upper arm of a three-phase inverter which has IGBTs 171A to 171D and diodes 181A to 181C connected in parallel. The IGBTs 171A to 171D and diodes 181A to 181C are semiconductor chips each of which has a square planer shape not more than 10 mm on a side. FIGS. 1 and 2 show an example including four IGBTs connected in parallel and three diodes connected in parallel.

As shown in the exploded perspective view of FIG. 2, the four IGBTs 171A to 171D connected in parallel and the three diodes 181A to 181C connected in parallel, which constitute the W-phase upper arm of the three-phase inverter, are arranged in a line on a first W-phase upper arm conductor 33, which constitutes the W-phase upper arm of the three-phase inverter. Collector sides (or positive sides) thereof are joined to the first W-phase arm conductor 33 with thermal buffer plates 34 interposed therebetween. Emitter sides (or negative sides) of the IGBTs 171A to 171D and the three diodes 181A to 181C connected in parallel are joined to a second W-phase upper arm conductor 35 with thermal buffer plates 34 interposed therebetween.

Material of the first and second W-phase upper arm conductors 33 and 35 is desirably copper from the viewpoint of a later-described operation of cooling the semiconductor chips. However, the material thereof may be other metal such as aluminum or metallic composite material such as Al—SiC.

Material of the thermal buffer plates 34 is a material having a linear expansion coefficient about intermediate between that of Si which is a material of the IGBTs 171A to 171D and diodes 181A to 181C and that of the material of the first and second W-phase arm conductors 33 and 35, and is, for example, a low-thermal expansion metal material such as Mo. The heat buffer plates 34 need to be provided especially when long life is required.

As for joint of the IGBTs 171A to 171D or diodes 181A to 181C with the thermal buffer plates 34 or joint of the first or second W-phase upper arm conductor 33 or 35 with the thermal buffer plates 34, such joint can be carried out by use of low melting point solder, for example, such as Sn/Pb or high melting point solder, for example, such as Sn/Ag/Cu or may be carried out by use of conductive adhesive, for example, such as silver paste.

Furthermore, as shown in FIG. 3, as for the first and second W-phase upper arm conductors 33 and 35, surfaces (bottom surfaces) perpendicular to joint surfaces of the first and second W-phase upper arm conductors 33 and 35 are bonded to a cooler 22 using a W-phase insulating resin sheet 36 containing ceramics so that the joint surfaces are perpendicular to the surface of the cooler 22. Herein, the joint surfaces are surfaces of the first and second W-phase upper arm conductors 33 and 35 which are joined to the positive (collector side) and negative (emitter side) electrodes of the IGBTs 171A to 171D and diodes 181A to 181C. The IGBTs 171A to 171D and diodes 181A to 181C are cooled by heat transfer to the first and second W-phase upper arm conductors 33 and 35 in a state where planes extended from the both surfaces of each of the IGBTs 171A to 171D and diodes 181A to 181C on which the positive and negative electrodes are individually provided are orthogonal to the surface of the cooler 22.

The W-phase insulating resin sheet 36 is, for example, composed of insulating resin filled with a ceramic filler such as boron nitride. The W-phase insulating resin sheet 36 has a thermal conductivity of 2 to 4 W/mK and a thickness of about 0.05 to 0.15 mm.

In adjacent to the second W-phase upper arm conductor 35, a first W-phase lower arm conductor 37 and a second W-phase lower arm conductor 38, to which IGBTs and diodes constituting a W-phase lower arm are joined, are arranged with certain insulating distances ensured therefrom. The first and second W-phase lower arm conductors 37 and 38 are bonded to the W-phase insulating resin sheet 36 with a same structure as that of the upper arms.

The first W-phase upper arm conductor 33 is connected to a W-phase positive terminal 39; the second W-phase upper arm conductor 35 and first W-phase lower arm conductor 37 are connected to a W-phase output terminal 41; and the second W-phase lower arm conductor 38 is connected to a W-phase negative terminal 40.

A V-phase insulating resin sheet 42 and a U-phase insulating resin sheet 43 are bonded to the cooler 22 with certain distances apart from the W-phase insulating resin sheet 36. The structure of a power semiconductor device on each insulating resin sheet is entirely the same as that on the W-phase insulating resin sheet.

The material of the IGBTs 171 and diodes 181 shown in FIGS. 1 and 2 is Si. When the material of the first and second W-phase upper arm conductors 33 and 35 joined to these semiconductor chips is copper, the linear expansion coefficient of the IGBTs and diodes is different from that of the conductors. In this case, a temperature cycle due to heat generated from the IGBTs is applied by operation and stop of the inverter unit, and shearing stress is generated in solder joining the IGBTs or diodes to the conductors with the thermal buffer plates 34 interposed therebetween, thus generating nonlinear strain. If the nonlinear strain increases, cracks or the like may occur in the solder with time. Accordingly, the value of the nonlinear strain is desired to be small in order to improve the reliability and durability of the inverter unit especially when the thermal buffer plates 34 are not provided or in order to further improve the reliability and durability of the inverter unit even if the thermal buffer plates 34 are provided. Herein, when chip size of the IGBTs 171 and diodes 181 increases, the nonlinear strain of the solder increases. In order to ensure the reliability and durability of the inverter unit, the chip size in a plan view needs to be about not more than 10 mm on a side.

On the other hand, when the chip size of the IGBTs 171 and diodes 181 is configured to be not more than 10 mm on a side as described above, current carrying capacity per chip is small. Accordingly, if an inverter unit of several tens kW for use in electric vehicles is composed of such a chip, the capacity thereof is insufficient. In order to constitute such an inverter unit for electric vehicles, a plurality of chips therefore need to be connected in parallel.

Moreover, especially in order to reduce the increase in temperature at the interval activation and reduce steady thermal resistance by the effect of each conductor on heat diffusion, areas of the surfaces (bottom surfaces) of the U-, V-, and W-phase first and second conductors which are bonded to the cooler 22 need to be equal to the areas of the surfaces of upper and lower arm conductors 25 and 26 which are bonded to a cooler 22 in the inverter unit disclosed in the Japanese Patent Laid-open Publication No. 2003-153554 and shown in FIG. 11.

A description is given of an operational effect of the inverter unit according to the first and second embodiments.

FIG. 4 is a view showing, as an analysis result of heat flux in the steady state, flow of heat when heat generated as heat loss in the IGBT 171A, which is a semiconductor chip, is conducted to the cooler 22 to be cooled. The analysis result shown in FIG. 4 is obtained at a cross section along IV-IV of FIG. 1.

FIG. 5 shows an analysis result of a comparison of transient thermal resistance of the semiconductor chips between the conventional general power semiconductor device shown in FIGS. 7 to 9, power semiconductor device disclosed in the Japanese Patent Laid-open Publication No. 2003-153554 and shown in FIG. 11, and the power semiconductor device of the inverter unit of the present invention. In the analyses of FIGS. 4 and 5, the material of the first and second conductors is copper.

In the power semiconductor device of FIG. 11 described in the Japanese Patent Laid-open Publication No. 2003-153554, the bonding wires are very thin, and thermal resistance thereof is very large. Accordingly, as for the heat loss generated in IGBT 172A, most of the heat loss is conducted to the lower arm conductor 26 and released to the cooler 22.

On the other hand, in the power semiconductor device in the inverter unit of the present invention, as shown by heat flux indicated by arrows in FIG. 4, about half of the heat generated in the IGBT 172A is conducted to the first W-phase upper arm conductor 33 through the joint surface while the other half is conducted to the second W-phase arm conductor 35. All the heat is further conducted to the cooler 22 to be cooled. As apparent from FIG. 4, by the structure of the embodiment, each of the IGBTs and diodes is cooled through both the positive and negative surfaces by the conductors having a large heat capacity.

In the present invention, each IGBT is thus cooled by the first and second conductors through the both surfaces thereof, so that the cooling efficiency is high. Showing this in the graph of FIG. 5, the steady thermal resistance for 10 to 20 sec is reduced by about 40% compared to the power semiconductor device of FIG. 11 described in the Japanese Patent Laid-open Publication No. 2003-153554. Furthermore, the transient thermal resistance for 0.1 to 0.3 sec, which causes a problem at the inverter activation, is reduced by about 50% compared to the power semiconductor device of FIG. 11 described in the Japanese Patent Laid-open Publication No. 2003-153554 because of the effect of cooling each semiconductor chip through both surfaces thereof by the first and second conductors and the effect of the heat capacities of these conductors.

Moreover, in the power semiconductor device used in the inverter unit of the present invention, the electrical wiring of the main circuit is completed by joining the IGBTs and diodes to the first and second conductors by solder. This eliminates the need for a process to connect a plurality of bonding wires like the power semiconductor device of FIG. 11 described in the Japanese Patent Laid-open Publication No. 2003-153554, thus reducing the manufacturing time.

Furthermore, in the power semiconductor device used in the inverter unit of the present invention, the IGBTs and diodes are wired by the first conductor on the positive side and the second conductor on the negative side. Accordingly, directions of currents flowing through the first and second conductors are opposite to each other, and wiring inductance due to the wiring is much smaller than those of the conventional general semiconductor device and the power semiconductor device described in the Japanese Patent Laid-open Publication No. 2003-153554.

As described above, in the inverter unit shown in FIGS. 1 to 5 according to the first and second embodiments of the present invention, the thermal resistance of the IGBTs and diodes within the power semiconductor device is further reduced, and the increase in temperature of the IGBTs and diodes is reduced both at the inverter activation and in the steady state, thus increasing the cooling efficiency. Furthermore, the wiring inductance within the power semiconductor device becomes very small. It is therefore possible to achieve an improvement in reliability and reduction in size of the inverter unit and increase the manufacturing yield of the power semiconductor device.

In the inverter unit shown in FIGS. 1 to 5, the first and second W-phase upper arm conductors 33 and 35 are arranged so that the joint surfaces thereof which are joined to the positive (collector side) and negative (emitter side) electrodes of the IGBTs 171A to 171D and diodes 181A to 181C are perpendicular to the surface of the cooler 22. However, the inverter unit of the present invention is not limited to one in which the joint surfaces and the surface of the cooling face are arranged perpendicular to each other. Specifically, the angles between the joint surfaces and the surface of the cooling face are not particularly limited if the joint surfaces and the surface of the cooing face are arranged in non-parallel to each other so that the both surfaces of each of the IGBTs and diodes can be cooled by the first and second conductors.

Third and Fourth Embodiments

Next, a description is given of third to fourth embodiments of the present invention using FIG. 2.

In the power semiconductor device shown in FIG. 2, input/output terminals 45 including gate terminals and sense terminals are bonded by an input/output terminal insulating resin sheet 44, which is the same as the W-phase insulating resin sheet 36, and mounted on the first W-phase upper arm conductor 33. The IGBTs 171A to 171D are connected to the input/output terminals 45 including the gate and sense terminals by the bonding wires 29. Furthermore, in the second W-phase upper arm conductor 35, a wiring notch 46 is provided so as to allow wiring of the bonding wires 29.

In a method of manufacturing the power semiconductor device shown in FIG. 2, first, the input/output terminals 45 in the first W-phase upper arm conductor 33 are bonded and mounted by the input/output terminal insulating resin sheet 44. Next, the first W-phase upper arm conductor 33, the IGBTs 171A to 171D and diodes 181A to 181C, the thermal buffer plate 34, and the second W-phase arm conductor 35 are joined by solder or conductive adhesive. Eventually, as shown in FIG. 1, the input/output terminals 45 are connected to the IGBTs 171A to 171D by the bonding wires 29 using space of the wiring notch 46.

The other configuration is the same as that of the first and second embodiments.

With the inverter unit of the structure shown in FIG. 2, after the manufacturing of the semiconductor device shown in FIG. 1 is completed, it is possible to perform an electrical property inspection to pick out a defective semiconductor chip using the input/output terminals before the semiconductor device is bonded to the cooler. Accordingly, the defectives can be eliminated in the middle of manufacturing, thus increasing the manufacturing yield.

Fifth Embodiment

Figure 6:
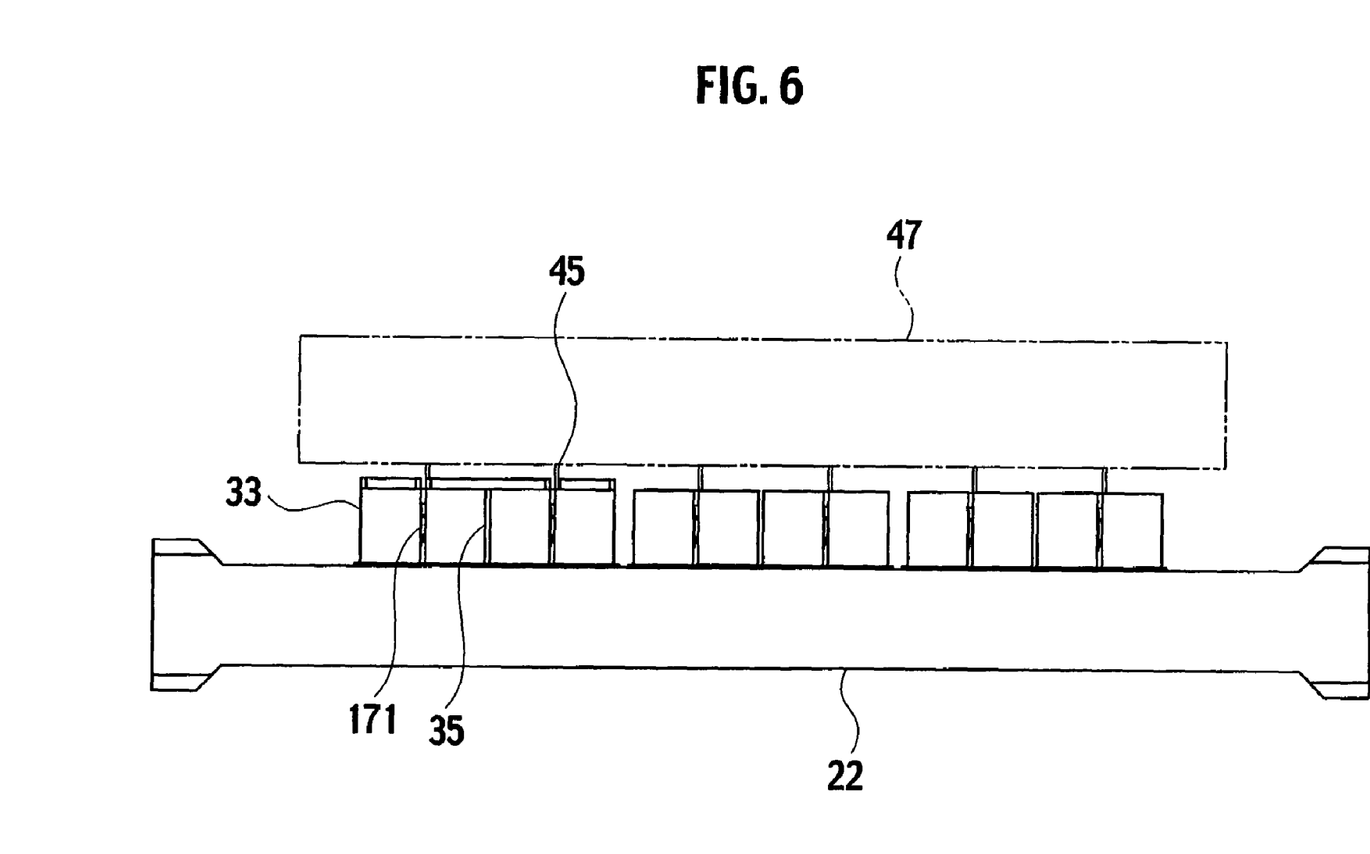
FIG. 6 is a view of the inverter device according to a fifth embodiment of the present invention, especially showing connections between the power semiconductor device and a control and drive substrate.

A description is given of a fifth embodiment of the present invention with reference to FIG. 6.

FIG. 6 is a view of the inverter unit of the fifth embodiment of the present invention, especially showing connections of the power semiconductor device and a control and drive substrate.

In FIG. 6, the power semiconductor device includes a control/drive substrate 47, which controls and drives the semiconductor chips, just above the first and second W-phase upper arm conductors 33 and 35 on the side opposite to the cooler 22 with respect to the IGBTs and diodes as the semiconductor chips. The control/drive substrate 47 is connected to the input/output terminals 45. The other configuration is the same as that of the first to fourth embodiments.

In the conventional known semiconductor device, when each semiconductor chip is cooled through the both surfaces thereof, the connections between the control/drive substrate and input/output terminals tend to be complicated and long. However, the employment of the structure of the power semiconductor device of the present invention allows the wires between the control/drive substrate and the input/output terminals to be minimized while each semiconductor chip is efficiently cooled through the both surfaces thereof since the input/output terminals 45 are exposed in the upper part opposite to the coolant 22 at shortest distances to the control/drive substrate.

In the inverter unit of the structure shown in FIG. 6, the wires between the control/drive substrate and input/output terminals are minimized. This reduces errors due to noise and the like, improving the reliability.

The invention claimed is:

1. An inverter unit, comprising:
a semiconductor chip constituting an arm of an inverter;
a first conductor joined to a positive side of the semiconductor chip; and
a second conductor joined to a negative side of the semiconductor chip, wherein
the first and second conductors are disposed on a cooler cooling the semiconductor chip and a joint surface of the first conductor which is joined to a positive electrode of the semiconductor chip and a joint surface of the second conductor which is joined to a negative electrode of the semiconductor chip are not in parallel to a surface of the cooler.

2. The inverter unit according to claim 1, wherein
the first and second conductors are bonded and fixed to the cooler with an insulating resin sheet interposed therebetween, the insulating resin sheet containing ceramics.

3. The inverter unit according to claim 1, wherein:
an input/output terminal insulated by an insulating resin sheet is provided on the first conductor.

4. The inverter unit according to claim 3, wherein
the semiconductor chip and the input/output terminal are connected by a bonding wire, and
the second conductor includes a notch which allows wiring of the bonding wire.

5. The inverter unit according to claim 1, wherein:
a control and drive substrate is provided just above the first and second conductors on a side opposite to the cooler with respect to the semiconductor chip.

6. The inverter unit according to claim 2, wherein:
an input/output terminal insulated by an insulating resin sheet is provided on the first conductor.

7. The inverter unit according to claim 2, wherein:
a control and drive substrate is provided just above the first and second conductors on a side opposite to the cooler with respect to the semiconductor chip.

8. The inverter unit according to claim 3, wherein:
a control and drive substrate is provided just above the first and second conductors on a side opposite to the cooler with respect to the semiconductor chip.

9. The inverter unit according to claim 4, wherein:
a control and drive substrate is provided just above the first and second conductors on a side opposite to the cooler with respect to the semiconductor chip.

10. The inverter unit according to claim 6, wherein:
the semiconductor chip and the input/output terminal are connected by a bonding wire, and
the second conductor includes a notch which allows wiring of the bonding wire.

* * * * *